United States Patent
Liu et al.

(10) Patent No.: US 9,263,594 B2
(45) Date of Patent: Feb. 16, 2016

(54) THIN FILM TRANSISTOR ARRAY BASEPLATE

(75) Inventors: Xiang Liu, Beijing (CN); Jianshe Xue, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 13/701,877

(22) PCT Filed: Aug. 20, 2012

(86) PCT No.: PCT/CN2012/080382
§ 371 (c)(1),
(2), (4) Date: Dec. 4, 2012

(87) PCT Pub. No.: WO2013/063971
PCT Pub. Date: May 10, 2013

(65) Prior Publication Data
US 2013/0181222 A1    Jul. 18, 2013

(30) Foreign Application Priority Data

Nov. 3, 2011   (CN) .......................... 2011 1 0344454

(51) Int. Cl.
*H01L 29/04* (2006.01)
*H01L 29/10* (2006.01)
(Continued)

(52) U.S. Cl.
CPC ...... *H01L 29/78693* (2013.01); *H01L 29/4908* (2013.01); *H01L 29/66969* (2013.01);
(Continued)

(58) Field of Classification Search
CPC .................... H01L 27/3262; H01L 29/78693; H01L 29/7869
USPC .................. 257/57, 59, 66, 72, 291, E29.117, 257/E29.151, E29.202, E29.273
See application file for complete search history.

(56) References Cited

U.S. PATENT DOCUMENTS 5,514,891 A * 5/1996 Abrokwah et al. ........... 257/346
5,614,739 A * 3/1997 Abrokwah et al. ........... 257/192
(Continued)

FOREIGN PATENT DOCUMENTS

CN          1405898 A     3/2003
CN        101884109 A    11/2010
(Continued)

OTHER PUBLICATIONS

International Search Report; mailed Nov. 29, 2012; PCT/CN2012/080382.
(Continued)

*Primary Examiner* — Ida M Soward
(74) *Attorney, Agent, or Firm* — Ladas & Parry LLP (57) ABSTRACT

An embodiment of the present invention provides a TFT array substrate including: a base substrate (1) and thin film transistors. The thin film transistor includes a gate electrode (2), a semiconductor layer (5), a semiconductor protective layer, a source electrode (8) and a drain electrode (9). The semiconductor protective layer is disposed adjacent to the semiconductor layer (5) and includes a composite lamination structure, which includes a protective layer formed of an insulating material capable of preventing de-oxygen of the semiconductor layer (5) and an insulating layer formed of an insulating material to be etched more easily.

16 Claims, 4 Drawing Sheets

(51) Int. Cl.
    *H01L 31/036* (2006.01)
    *H01L 31/0376* (2006.01)
    *H01L 31/20* (2006.01)
    *H01L 29/76* (2006.01)
    *H01L 31/112* (2006.01)
    *H01L 29/15* (2006.01)
    *H01L 31/062* (2012.01)
    *H01L 31/113* (2006.01)
    *H01L 29/786* (2006.01)
    *H01L 29/49* (2006.01)
    *H01L 29/66* (2006.01)
    *H01L 27/32* (2006.01)

(52) U.S. Cl.
    CPC ...... H01L29/7869 (2013.01); H01L 29/78603 (2013.01); H01L 29/78606 (2013.01); *H01L 27/3262* (2013.01)
    USPC ............. 257/59; 257/57; 257/66; 257/72; 257/291; 257/E29.117; 257/E29.151; 257/E29.202; 257/E29.273

(56) References Cited

U.S. PATENT DOCUMENTS

| | | | |
|---|---|---|---|
| 5,909,615 A * | 6/1999 | Kuo | 438/157 |
| 5,917,225 A * | 6/1999 | Yamazaki et al. | 257/411 |
| 5,982,799 A * | 11/1999 | Bour et al. | 372/50.121 |
| 6,229,156 B1 | 5/2001 | Murai et al. | 257/57 |
| 6,407,782 B1 * | 6/2002 | Kim | 349/106 |
| 6,503,772 B1 * | 1/2003 | Ohtsu et al. | 438/30 |
| 6,569,720 B2 * | 5/2003 | Kunii | 438/151 |
| 6,624,871 B1 * | 9/2003 | Kim | 349/192 |
| 6,646,284 B2 * | 11/2003 | Yamazaki et al. | 257/59 |
| 6,815,723 B2 * | 11/2004 | Yamazaki et al. | 257/88 |
| 6,927,456 B2 * | 8/2005 | Honda | 257/347 |
| 7,057,209 B2 * | 6/2006 | Yamazaki et al. | 257/88 |
| 7,704,765 B2 * | 4/2010 | Maruyama et al. | 438/30 |
| 7,777,231 B2 * | 8/2010 | Gan et al. | 257/72 |
| 7,786,485 B2 * | 8/2010 | Dairiki et al. | 257/72 |
| 7,791,107 B2 * | 9/2010 | Gupta et al. | 257/192 |
| 7,982,206 B2 * | 7/2011 | Yamazaki et al. | 257/13 |
| 7,994,617 B2 * | 8/2011 | Arai et al. | 257/679 |
| 8,022,622 B2 * | 9/2011 | Choi et al. | 313/507 |
| 8,030,141 B2 * | 10/2011 | Lee et al. | 438/151 |
| 8,106,398 B2 * | 1/2012 | Yamazaki et al. | 257/66 |
| 8,115,206 B2 * | 2/2012 | Sakakura et al. | 257/66 |
| 8,134,149 B2 * | 3/2012 | Yamazaki et al. | 257/40 |
| 8,278,158 B2 * | 10/2012 | Moon et al. | 438/149 |
| 8,304,779 B2 * | 11/2012 | Yamazaki et al. | 257/66 |
| 8,384,076 B2 * | 2/2013 | Park et al. | 257/43 |
| 8,405,073 B2 * | 3/2013 | Ono et al. | 257/40 |
| 8,426,324 B2 * | 4/2013 | Tanaka et al. | 438/795 |
| 8,546,803 B2 * | 10/2013 | You et al. | 257/57 |
| 8,546,912 B2 * | 10/2013 | Yamazaki et al. | 257/531 |
| 8,575,713 B2 * | 11/2013 | Makita et al. | 257/458 |
| 8,759,917 B2 * | 6/2014 | Park et al. | 257/347 |
| 9,048,147 B2 * | 6/2015 | Yamazaki et al. | 345/92 |
| 2002/0117668 A1 * | 8/2002 | Kim | 257/59 |
| 2003/0047785 A1 | 3/2003 | Kawasaki et al. | |
| 2004/0164296 A1 * | 8/2004 | Yamazaki et al. | 257/59 |
| 2005/0101062 A1 * | 5/2005 | You | 438/128 |
| 2006/0008931 A1 * | 1/2006 | Lee et al. | 438/30 |
| 2006/0208263 A1 * | 9/2006 | Yamazaki et al. | 257/83 |
| 2007/0295964 A1 * | 12/2007 | Ishikawa | 257/66 |
| 2008/0012021 A1 * | 1/2008 | Adachi | 257/72 |
| 2008/0280385 A1 * | 11/2008 | Tanaka | 438/30 |
| 2009/0321743 A1 * | 12/2009 | Isa et al. | 257/66 |
| 2009/0321753 A1 * | 12/2009 | Yamazaki et al. | 257/88 |
| 2010/0090208 A1 | 4/2010 | Moon et al. | |
| 2010/0148170 A1 * | 6/2010 | Ueda et al. | 257/43 |
| 2010/0255633 A1 * | 10/2010 | Cho et al. | 438/99 |
| 2010/0283049 A1 | 11/2010 | Sato et al. | |
| 2011/0278583 A1 * | 11/2011 | Hayashi et al. | 257/72 |
| 2012/0146009 A1 * | 6/2012 | Itoh et al. | 257/40 |
| 2012/0206668 A1 * | 8/2012 | Sugawara | 349/42 |
| 2013/0009185 A1 * | 1/2013 | Yamazaki et al. | 257/98 |
| 2013/0021719 A1 | 1/2013 | Busch et al. | |
| 2013/0026574 A1 * | 1/2013 | Nakanishi et al. | 257/347 |
| 2013/0140577 A1 * | 6/2013 | Ishikawa | 257/71 |
| 2013/0217191 A1 * | 8/2013 | Yamazaki et al. | 438/158 |
| 2014/0103351 A1 * | 4/2014 | Liu et al. | 257/72 |
| 2014/0319499 A1 * | 10/2014 | Yamazaki et al. | 257/40 |

FOREIGN PATENT DOCUMENTS

| | | |
|---|---|---|
| JP | 2009-141002 A | 6/2009 |
| KR | 20010046652 A | 6/2001 |
| KR | 20110080118 A | 7/2011 |

OTHER PUBLICATIONS

KIPO Office Action dated Oct. 22, 2013; Appln. No. 10-2012-7030279.
First Chinese Office Action dated Feb. 8, 2014; Appln. No. 201110344454.7.
Second Chinese Office Action dated Sep. 1, 2014; Appln. No. 201110344454.7.
Korean Notice of Allowance dated Sep. 23, 2014; Appln. No. 10-2012-7030279.
Extended European Search Report Appln. No. 12791676.5-1504/2779249 PCT/CN2012080382; Dated Jun. 11, 2015.

* cited by examiner

THIN FILM TRANSISTOR ARRAY BASEPLATE

CROSS REFERENCE TO RELATED APPLICATIONS

This application is a national stage application under 35 U.S.C. 371 and claims the benefit of PCT Application No. PCT/CN2012/080382 having an international filing date of Aug. 20, 2012, which designated the United States, which PCT application claimed the benefit of Chinese Application No. 201110344454.7 filed Nov. 3, 2011, the disclosure of each of which are incorporated herein by reference.

TECHNICAL FIELD

An embodiment of the present invention relates to a thin film transistor (TFT) array substrate.

BACKGROUND

Along with the development of the display manufacturing technologies, thin film transistor liquid crystal displays (TFT-LCDs) have been prevailing in the recent flat display market due to characteristics, such as compactness, low power consumption, and non radiation, and the like.

A prior art process for producing a TFT array substrate commonly comprises: depositing a gate metal film, a gate insulating film, a metal oxide film (semiconductor film), a source-drain metal film, a passivation layer film as well as a transparent conductive film onto a substrate, and forming successively, through several photolithography processes, the patterns of a gate electrode, a gate insulating layer, a semiconductor layer, a source electrode, a drain electrode, a passivation layer as well as a transparent pixel electrode. Usually, one photolithography process successively comprises film formation, exposure, development, etching and removing etc.; the etching process comprises dry etching and wet etching. Wet etching has the drawbacks of poor anisotropy, severe undercutting, poor control on patterns, failure for fine characteristic dimensions, production of considerable chemical liquid waste, and the like; in contrast, due to the advantages, such as good anisotropy, good controllability, flexibility, repeatability, processing safety, easy automation, no chemical liquid waste, no contamination introduced during process, and high brilliancy, and the like, dry etching is widely used in the photolithography process for a TFT array substrate.

In the above processes for making a TFT array substrate, the formation of the semiconductor layer and the source electrode as well as the drain electrode is conducted through successive processes, that is, the semiconductor layer film is firstly deposited and then the source-drain metal film are deposited. In order to prevent the damages to the semiconductor film in depositing the source-drain metal film, typically one etching stop layer is deposited onto the semiconductor film, and next the source-drain metal film is deposited. After the patterning process, the etching stop layer retains within the channel between the source electrode and the drain electrode over the semiconductor layer. One surface of the semiconductor layer contacts the etching stop layer, and the other surface contacts the gate insulating layer. The etching stop layer and the gate insulating layer are usually formed of an insulating material, such as $SiN_x$, $Al_2O_3$, $SiO_x$, etc. If the semiconductor layer is formed of a metal oxide material and the etching stop layer and the gate insulating layer are formed of $SiN_x$, $SiN_x$ contained in the etching stop layer and the gate insulating layer will seize the oxyanion in the metal oxide of the semiconductor layer, causing de-oxygen of the metal oxide of the semiconductor layer and thus unstable behavior of the TFT array substrate.

In order to enhance the stability of the TFT array substrate, the etching stop layer and the gate insulating layer may also be formed of $Al_2O_3$ or $SiO_x$. However, in the case of dry etching, if the patterns of the etching stop layer and the gate insulating layer are formed of $Al_2O_3$ or $SiO_x$, the etching rate will be low, which is adverse to large scale production.

SUMMARY

A technical problem overcome by embodiments of the present invention is to provide a TFT array substrate capable of improving the stability of thin film transistor (TFT) device and further suitable for large-scale production.

One embodiment of the present invention provides a TFT array substrate, comprising a base substrate and a thin film transistor functioning as a switching element. The thin film transistor comprises a gate electrode, a semiconductor layer, a semiconductor protective layer, a source electrode and a drain electrode. The semiconductor protective layer is disposed adjacent to the semiconductor layer and comprises a composite lamination structure, which comprises a protective layer formed of an insulating material capable of preventing de-oxygen of the semiconductor layer (5) and an insulating layer formed of an insulating material to be etched more easily.

For example, the gate electrode is arranged on the base substrate, and the semiconductor layer is arranged over the gate electrode.

For example, the semiconductor protective layer comprises a gate insulating composite lamination structure arranged between the gate electrode and the semiconductor layer and adjacent to a lower side of the semiconductor layer, and the gate insulating composite lamination structure comprises a gate insulating protective layer formed of an insulating material capable of preventing de-oxygen of the semiconductor layer while contacting the semiconductor layer and a gate insulating layer formed of an insulating material to be etched more easily.

For example, the source electrode and the drain electrode are arranged above the semiconductor layer with a channel defined therebetween.

For example, the semiconductor protective layer comprises an etching stop composite lamination structure, which comprises an etching stop protective layer formed of an insulating material capable of preventing de-oxygen of the semiconductor layer while contacting the semiconductor layer and an etching stop insulating layer formed of an insulating material to be etched more easily.

For example, the semiconductor layer is provided on the base substrate, and the gate electrode is provided on the semiconductor layer.

For example, the semiconductor protective layer is a buffer insulating composite lamination structure located between the substrate and the semiconductor layer and contacting a lower side of the semiconductor layer, and the buffer insulating composite lamination structure comprises a buffer insulating protective layer formed of an insulating material capable of preventing de-oxygen of the semiconductor layer while contacting the semiconductor layer and a buffer insulating layer formed of an insulating material to be etched more easily.

For example, the source electrode and the drain electrode are arranged on the semiconductor layer with a channel defined therebetween.

For example, the semiconductor protective layer comprises an etching stop composite lamination structure located within the channel and adjacent to the topside of the semiconductor layer, and the etching stop composite lamination structure comprises an etching stop protective layer formed of an insulating material capable of preventing de-oxygen of the semiconductor layer while contacting the semiconductor layer and an etching stop insulating layer formed of an insulating material to be etched more easily.

For example, the semiconductor layer is formed of a metal oxide semiconductor material.

For example, the ratio of the thickness of the protective layer to that of the insulating layer is in a range of 1/10 to 3/5.

For example, a thickness of the protective layer is in a range of 300 Å to 1500 Å, and a thickness of the insulating layer is in a range of 1000 Å to 20000 Å.

For example, the etching stop protective layer is formed of silicon oxide or metal oxide, and the etching stop insulating layer is formed of nitride or organic insulating materials.

For example, the protective layer is formed of $SiO_x$ or $Al_2O_3$, and the insulating layer is formed of $SiN_x$ or organic resins.

For example, the array substrate further comprises a passivation layer and a transparent pixel electrode.

For example, the reacting gases correspondingly for forming $SiN_x$ is $SiH_4$, $NH_3$ and $N_2$, or $SiH_2Cl_2$, $NH_3$ and $N_2$.

In the TFT array substrate according to the embodiment of the present invention, the semiconductor protective layer adjacent to the semiconductor layer employs a composite lamination structure, in which the protective layer contacting the semiconductor layer is formed of an insulating material capable of preventing de-oxygen of the semiconductor layer, for example, silicon oxide or metal oxide, which structure can avoid de-oxygen of the semiconductor layer and thus be in favor of improving the stability of the TFT array substrate; the insulating layer contacting the protective layer (i.e., not contacting the semiconductor layer) is formed of an insulating material to be etched more easily, for example, nitride or organic insulating materials, which structure is beneficial to improve the overall etching speed for the array substrate, and therefore improve the productive capacity and is suitable for large-scale production.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIG. 1(a)-(f) is structural schematic view of the TFT array substrate according to a first embodiment of the present invention, wherein:

FIG. 2(a)-(f) is structural schematic view of the TFT array substrate according to a second embodiment of the present invention, wherein:

| | |
|---|---|
| 1—substrate; | 2—gate electrode; |
| 3—gate insulating layer; | 4—gate insulating protective layer; |
| 5—semiconductor layer; | 6—etching stop protective layer; |
| 7—etching stop insulating layer; | 8—source electrode; |
| 9—drain electrode; | 10—passivation layer; |
| 11—transparent pixel electrode; | 12—via hole; |
| 13—buffer insulating protective layer; | |
| 14—buffer insulating layer; | 15—channel. |

DETAILED DESCRIPTION

The objects, solutions and advantages of the embodiments of the present invention will be more apparent from the following clear and complete description about the embodiments of the present invention in connection with embodiments and accompany drawings. Obviously, the described embodiments are merely part of the embodiments of the present invention, but not all the embodiments. Based on the described embodiments of the present invention, all the other embodiments achieved by the ordinary skilled in this art without any creative work belong to the protective scope of the present invention.

In an embodiment of the present invention, a TFT array substrate comprises: a base substrate 1 and a thin film transistor acting as a switching element. The thin film transistor comprises a gate electrode 2, a semiconductor layer 5, a semiconductor protective layer, a source electrode 8 and a drain electrode 9. The semiconductor protective layer adjacent to the semiconductor layer 5 adopts a composite lamination structure. The composite lamination structure comprises a protective layer formed of an insulating material capable of preventing de-oxygen of the semiconductor layer 5 while contacting the semiconductor layer 5 and an insulating layer formed of an insulating material to be etched more easily.

The TFT array substrate comprise a plurality of gate lines and a plurality of data lines, these gate lines and data lines intersect one another so as to define a plurality of pixel areas in an array arrangement, and each pixel area comprises a thin film transistor; the gate electrode of the thin film transistor is connected with a corresponding gate line or formed integratedly with the gate line, and the source electrode of the thin film transistor is connected with a corresponding data line or formed integratedly with the data line. The following description is made only for a thin film transistor of one pixel area, but the description also applies for the thin film transistors of other pixel areas.

Embodiment 1

Figure 1A:
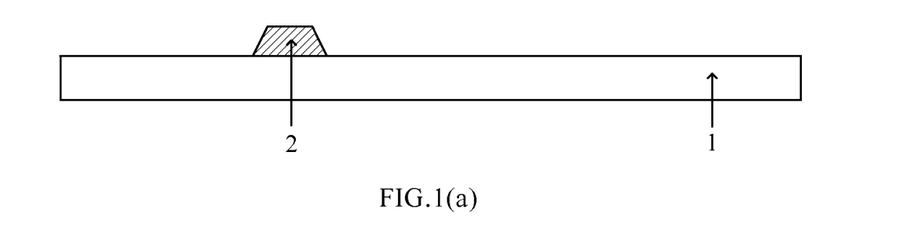
FIG. 1(a) is a structural schematic view of the TFT array substrate in the first embodiment after the first photolithography process.
Figure 1B:
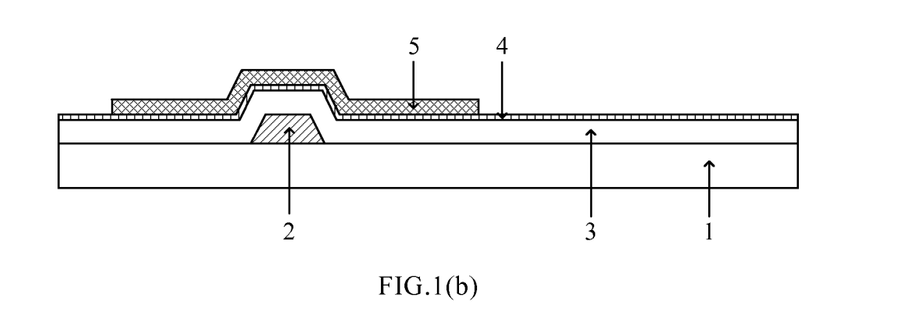
FIG. 1(b) is a structural schematic view of the TFT array substrate in the first embodiment after the second photolithography process.
Figure 1C:
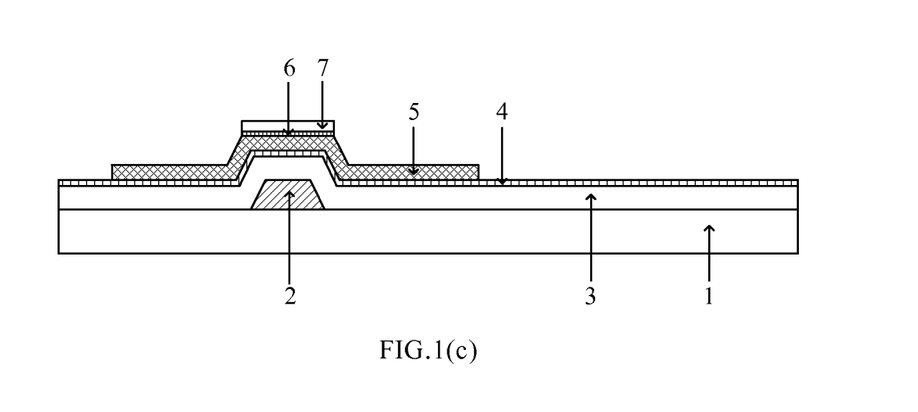
FIG. 1(c) is a structural schematic view of the TFT array substrate in the first embodiment after the third photolithography process.
Figure 1D:
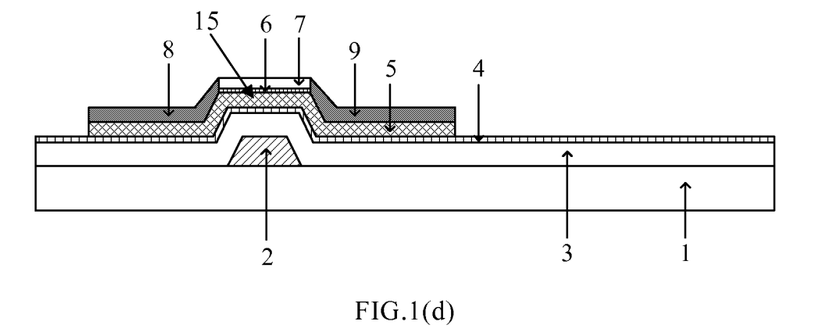
FIG. 1(d) is a structural schematic view of the TFT array substrate in the first embodiment after the fourth photolithography process.
Figure 1E:
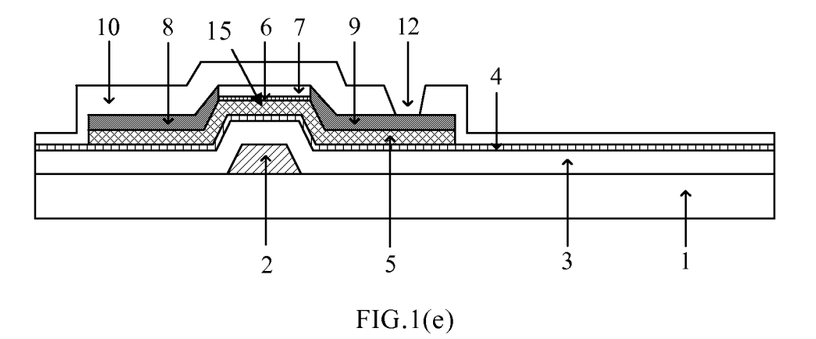
FIG. 1(e) is a structural schematic view of the TFT array substrate in the first embodiment after the fifth photolithography process.
Figure 1F:
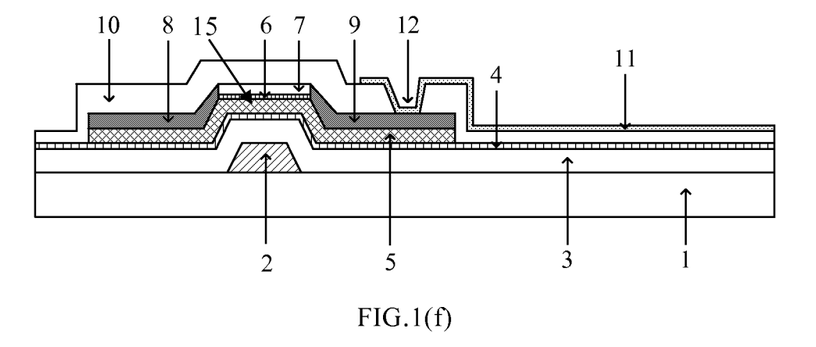
FIG. 1(f) is a structural schematic view of the TFT array substrate in the first embodiment after the sixth photolithography process.

As shown in FIG. 1(f), the TFT array substrate in this embodiment comprises: a base substrate 1; a gate electrode 2 formed on the base substrate 1; a gate insulating layer 3 covering the gate electrode 2 and extending onto the base substrate 1; a gate insulating protective layer 4 covering the gate insulating layer 3; a semiconductor layer 5 formed on the gate insulating protective layer 4; a source electrode 8 and a drain electrode 9 formed on the semiconductor layer 5, with a channel 15 being defined between the source electrode 8 and the drain electrode 9; a composite lamination structure formed in the channel 15, comprising an etching stop protective layer 6 and an etching stop insulating layer 7, wherein the etching stop protective layer 6 is located below the etching stop insulating layer 7 and contacts the semiconductor layer 5; a passivation layer 10 completely covering the source electrode 8, the etching stop insulating layer 7, and the drain electrode 9 as well as gate insulating protective layer 4, wherein a portion of the passivation layer 10 covering the drain electrode 9 is formed with a via hole 12; a transparent pixel electrode 11 formed on the passivation layer 10 and connected with the drain electrode 9 through the via hole 12.

In one example, the semiconductor protective layer adjacent to the semiconductor layer 5 comprises a composite lamination structure formed in the channel 15, i.e., comprises an etching stop protective layer 6 and an etching stop insulating layer 7 over the semiconductor layer 5.

In another example, the semiconductor protective layer adjacent to the semiconductor layer 5 comprises a composite lamination structure comprising the gate insulating layer 3 and the gate insulating protective layer 4, located below the semiconductor layer 5 and between the semiconductor layer 5 and the gate electrode 2.

In yet another example, the semiconductor protective layer adjacent to the semiconductor layer 5 comprises both of the cases of the above examples so as to provide protection for the semiconductor layer 5 on both the upper side and the lower side thereof.

The TFT array substrate in this embodiment is used, for example, for a vertically-driven type or horizontally-driven type liquid crystal display; however, the present invention is not limited thereto.

In this embodiment, the gate insulating layer 3/the etching stop insulating layer 7 has a thickness in a range from 1000 Å to 20000 Å and may be formed of nitride or organic insulating materials, for example, $SiN_x$ or organic resin. The reacting gases correspondingly for forming $SiN_x$ comprise $SiH_4$, $NH_3$ and $N_2$, or $SiH_2Cl_2$, $NH_3$ and $N_2$.

In this embodiment, the gate insulating protective layer 4/the etching stop protective layer 6 has a thickness in a range from 300 Å to 1500 Å and may be formed of silicon oxide or metal oxide, for example, $SiO_x$ or $Al_2O_3$.

The gate insulating layer 3, the gate insulating protective layer 4, the etching stop protective layer 6 and the etching stop insulating layer 7 for example may be formed by plasma enhanced chemical vapor deposition (PECVD) or sputtering.

In one example, the etching stop protective layer 6 and the gate insulating protective layer 4, which both contact the semiconductor layer 5, are each formed of the material(s) which can avoid de-oxygen of the semiconductor layer 5 but are difficult for etching; while the gate insulating layer 3 and the etching stop insulating layer 7, which both do not contact the semiconductor layer 5, are each formed of the material(s) to be etched more easily.

In this embodiment, in the composite lamination structure serving as the semiconductor protective layer, the ratio of the thickness of the gate insulating protective layer 4 to that of the gate insulating layer 3 is for example from 1/10 to 3/5. Or, in the composite lamination structure serving as the semiconductor protective layer, the ratio of the thickness of the etching stop protective layer 6 to that of the etching stop insulating layer 7 is for example from 1/10 to 3/5.

Due to the fact that the semiconductor protective layer, comprising the composite lamination structure formed of the above materials, will not seize the oxyanion in the semiconductor layer 5, the stability of the TFT array substrate is improved, and also the etching speed upon the gate insulating layer and the etching stop layer is increased, which promotes productive capacity and is suitable for large-scale production.

The base substrate 1 may employ a transparent non-alkali glass substrate or a quartz substrate, or employ other transparent substrates having certain hardness.

The semiconductor layer 5 is formed of a metal oxide semiconductor material, for example, transparent amorphous oxide semiconductor IGZO (In—Ga—Zn—O) and, for example, through sputtering method, and the thickness thereof is in a range from 50 Å to 1000 Å.

The gate electrode 2, the source electrode 8 and the drain electrode 9 is formed through sputtering or thermal evaporation method, and the range for their thicknesses is from 4000 Å to 15000 Å. The gate electrode 2, the source electrode 8 and the drain electrode 9 may be formed of a monolayer film formed of any one of Cr, W, Cu, Ti, Ta or Mo, or formed of alloy of any one of the above metals, or formed of a multilayer film formed of the any combination of the above metals.

The passivation layer 10 for example is formed by using PECVD and the range for the thickness is for example from 1000 Å to 3000 Å. The passivation layer 10 may be formed of oxide, nitride or oxynitride. The reacting gases correspondingly for forming nitride comprise $SiH_4$, NH3 and N2, or $SiH_2Cl_2$, NH3 and N2.

The transparent pixel electrode 11 is formed through sputtering or thermal evaporation method, and the range for the thickness is for example from 300 Å to 1500 Å, and the transparent pixel electrode 11 may be formed of a transparent metal oxide material, for example, formed of an ITO film or an IZO film.

The TFT array substrate in this embodiment may be formed by using six photolithography processes. One exemplary workflow is described as follows with reference to FIGS. 1(a)-1(f).

Step (1): as shown in FIG. 1(a), a gate metal film is deposited onto a base substrate 1 and then through a first photolithography process, is formed into the patterns of the gate electrode 3 and the gate scanning line (not shown in the figures).

Step (2): as shown in FIG. 1(b), on the substrate after step (1) a gate insulating film and a metal oxide used for forming the semiconductor layer are deposited sequentially, and then through a secondary photolithography process, are formed into the patterns of the gate insulating layer 3, the gate insulating protective layer 4 and the semiconductor layer 5. The gate insulating layer 3 covers the gate electrode 2 and extends to the base substrate 1. The gate insulating protective layer 4 covers the gate insulating layer 3, and the plain size of the gate insulating protective layer 4 is substantially the same as that of the gate insulating layer 3.

Step (3): as shown in FIG. 1(c), on the substrate after step (2) two layers of etching stop insulating films are deposited, and then through a third photolithography process, are formed into the patterns of the etching stop protective layer 6 and the etching stop insulating layer 7. The etching stop insulating layer 7 covers the etching stop protective layer 6 and has the same plane size as that of the etching stop protective layer 6, and the etching stop protective layer 6 is disposed on and contact with the semiconductor layer 5. The etching stop protective layer 6 and the etching stop insulating layer 7 essentially correspond to the channel region of the thin film transistor to be formed.

Step (4): as shown in FIG. 1(d), on the substrate after step (3) a source-drain metal film is deposited, and then through a fourth photolithography process, is formed into the patterns of the source electrode 8, the drain electrode 9 and the data scanning line (not shown in the figures). The source electrode 8 and the drain electrode 9 are provided on the semiconductor layer 5 and respectively arranged on both sides of the etching stop protective layer 6 and the etching stop insulating layer 7 while defining a channel therebetween.

Step (5): as shown in FIG. 1(e), on the substrate after step (4) a passivation layer film is deposited, and then through a fifth photolithography process, is formed into the pattern of the passivation layer 10 having a via hole 12, and the via hole 12 is located over the drain electrode 9 while exposing a part of the drain electrode 9.

Step (6): as shown in FIG. 1(f), on the substrate after step (5) a transparent conductive film is deposited, and then through a sixth photolithography process, is formed into a pattern of the transparent pixel electrode 11, and the transparent pixel electrode 11 is provided above the via hole 12 and contact the transparent pixel electrode 11 with the drain electrode 9 via the via hole 12.

In this embodiment, the etching process of the respective photolithography processes can be implemented with dry etching.

Embodiment 2

Figure 2A:
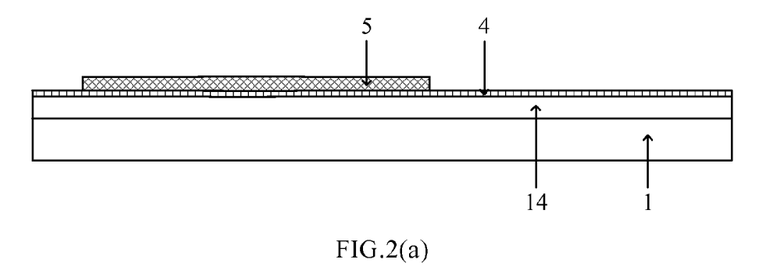
FIG. 2(a) is a structural schematic view of the TFT array substrate in the second embodiment after the first photolithography process.
Figure 2B:
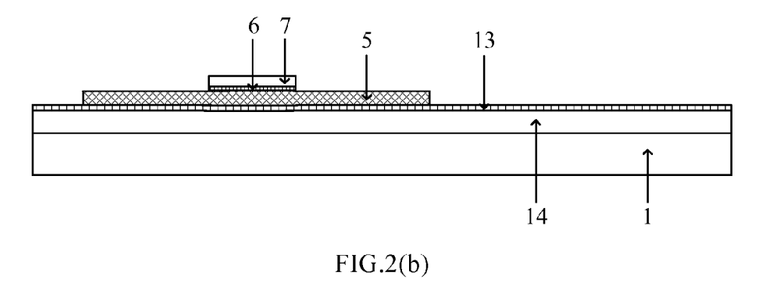
FIG. 2(b) is a structural schematic view of the TFT array substrate in the second embodiment after the second photolithography process.
Figure 2C:
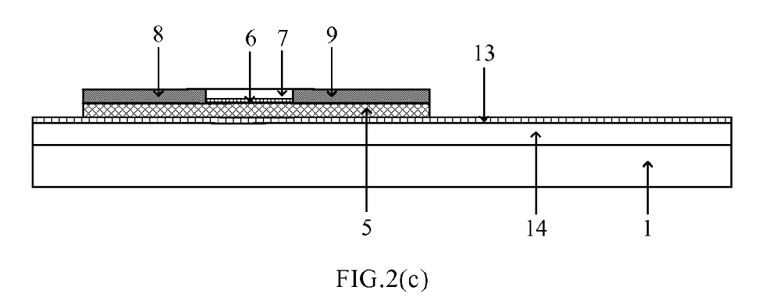
FIG. 2(c) is a structural schematic view of the TFT array substrate in the second embodiment after the third photolithography process.
Figure 2D:
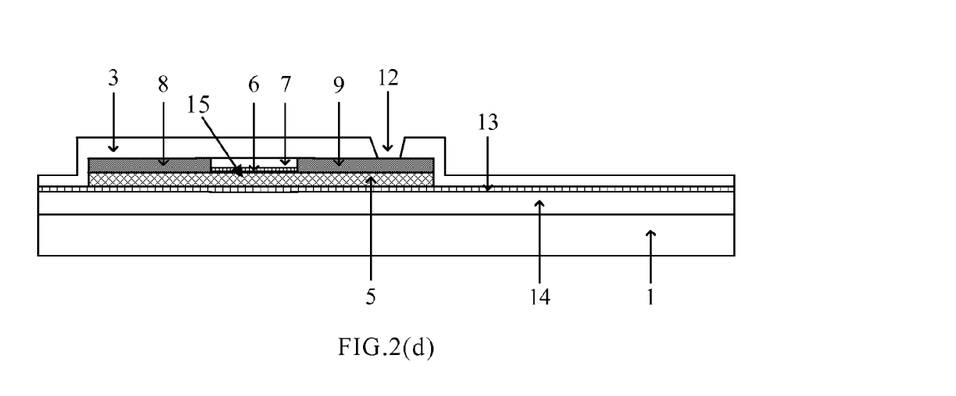
FIG. 2(d) is a structural schematic view of the TFT array substrate in the second embodiment after the fourth photolithography process.
Figure 2E:
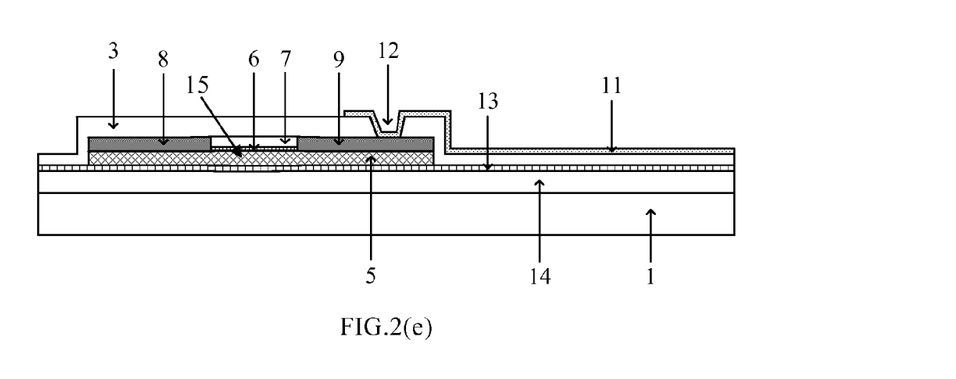
FIG. 2(e) is a structural schematic view of the TFT array substrate in the second embodiment after the fifth photolithography process.
Figure 2F:
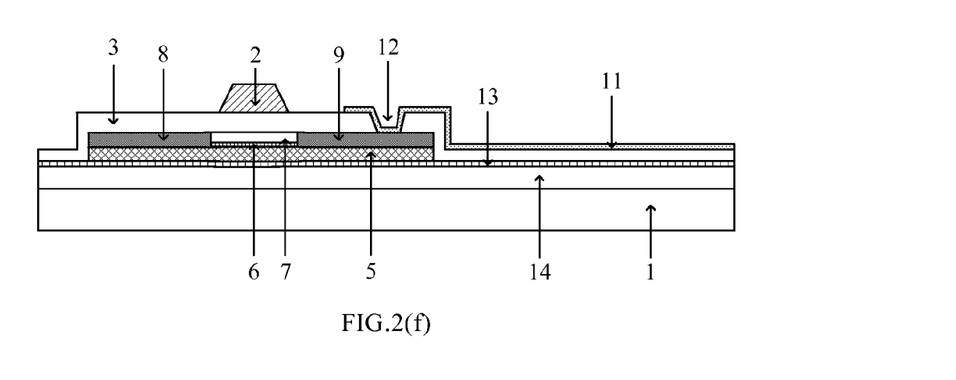
FIG. 2(f) is a structural schematic view of the TFT array substrate in the second embodiment after the sixth photolithography process.

As shown in FIG. 2(f), the TFT array substrate in this embodiment comprises: a base substrate 1; a buffer insulating layer 14 covering the base substrate 1; a buffer insulating protective layer 13 covering the buffer insulating layer 14; a semiconductor layer 5 formed on the buffer insulating protective layer 13; a source electrode 8 and a drain electrode 9 formed on the semiconductor layer 5, with a channel 15 being defined between the source electrode 8 and the drain electrode 9; a composite lamination structure formed in the channel 15, comprising an etching stop protective layer 6 and an etching stop insulating layer 7, with the etching stop protective layer 6 being arranged below the etching stop insulating layer 7 and contacting the semiconductor layer 5; a gate insulating layer 3 completely covering the source electrode 8, the etching stop insulating layer 7, the drain electrode 9 and the gate insulating protective layer 4, wherein the portion of the gate insulating layer 3 covering the drain electrode 9 is opened with a via hole 12; a transparent pixel electrode 11 formed on the gate insulating layer 3, the transparent pixel electrode 11 contacting the drain electrode 9 via the via hole 12.

In one example, the semiconductor protective layer adjacent to the semiconductor layer 5 comprises a composite lamination structure formed in the channel 15, i.e., comprises an etching stop protective layer 6 and an etching stop insulating layer 7.

In another example, the semiconductor protective layer adjacent to the semiconductor layer 5 comprises a composite lamination structure comprising a buffer insulating layer 14 and a buffer insulating protective layer 13, located between the semiconductor layer 5 and the base substrate 1.

In yet another example, the semiconductor protective layer adjacent to the semiconductor layer 5 comprises both of the above cases so as to provide protection for the semiconductor layer 5 at the upper side and lower side thereof.

Similarly, the TFT array substrate in this embodiment is used, for example, for a vertically-driven type or horizontally-driven type liquid crystal display; however, this invention is not limited thereto.

In this embodiment, the material, the thickness and the formation process for the buffer insulating layer 14 may be the same as that of the gate insulating layer 3/etching stop insulating layer 7 in the first embodiment.

In this embodiment, the material, the thickness and the formation process for the buffer insulating protective layer 13 may be the same as that of the gate insulating protective layer 4/etching stop protective layer 6 in the first embodiment.

In this embodiment, the gate insulating layer 3 does not directly contact with the semiconductor layer 5 and thus can adopt a monolayer structure, and the material, the thickness and the formation process for this monolayer structure maybe the same as that of the gate insulating layer 3/etching stop insulating layer 7 in the first embodiment and also maybe the same as that of the gate insulating protective layer 4/etching stop protective layer 6 in the first embodiment.

The material, the thickness and the formation process for the other layers constituting the array substrate structure of this embodiment may be the same as that in the first embodiment, and therefore its detailed description is omitted here.

The semiconductor layer 5 is formed of a metal oxide semiconductor material, for example, a transparent amorphous oxide semiconductor IGZO (In—Ga—Zn—O), for example, through sputtering method, and the thickness thereof is in a range from 50 Å to 1000 Å.

Due to the fact that the semiconductor protective layer, comprising a composite lamination structure formed of the above materials, will not seize the oxyanion in the semiconductor layer 5, the stability of the TFT array substrate is improved, and also the etching speed upon the gate insulating layer and the etching stop layer is increased, which promotes productive capacity and is suitable for large-scale production.

The TFT array substrate in this embodiment maybe formed through six photolithography processes, for example. One exemplary workflow is described as follows with reference to FIGS. 2(a)-(f).

Step (1): as shown in FIG. 2(a), on the base substrate 1 two layers of buffer insulating films and a metal oxide film are sequentially deposited, and then through a first photolithography process, are formed into the patterns of the buffer insulating layer 14, the buffer insulating protective layer 13 and the semiconductor layer 5; the buffer insulating protective layer 13 covers the buffer insulating layer 14 and have the same plane size as that of the buffer insulating layer 14, and the buffer insulating layer 14 covers the base substrate 1.

Step (2): as shown in FIG. 2(b), on the substrate after step (1) two layers of etching stop insulating films are deposited, and through a second photolithography process, are formed into the patterns of the composite lamination structure of the etching stop protective layer 6 and the etching stop insulating layer 7; the etching stop insulating layer 7 covers the etching stop protective layer 6 and has the same plane size as that of the etching stop protective layer 6, and the etching stop protective layer 6 is located onto and contact the semiconductor layer 5.

Step (3): as shown in FIG. 2(c), on the substrate after step (2) a source-drain metal film is deposited, and through a third photolithography process, is formed into the patterns of the source electrode 8, the drain electrode 9 and the data scanning line (not shown in the figures), and the source electrode 8 and the drain electrode 9 are located on the semiconductor layer 5 and provided respectively on both sides of the etching stop protective layer 6 and the etching stop insulating layer 7.

Step (4): as shown in FIG. 2(d), on the substrate after step (3) a gate insulating film is deposited, and then through a fourth photolithography process, is formed into the patterns of the gate insulating layer 3 and the via hole 12, and the via hole 12 is arranged over the drain electrode 9.

Step (5): as shown in FIG. 2(e), on the substrate after step (4) a transparent conductive film is deposited, and then through a sixth photolithography process, is formed into a pattern for the transparent pixel electrode 11, and the transparent pixel electrode 11 is provided above the via hole 12 and is connected with the transparent pixel electrode 11 with drain electrode 9 via the via hole 12.

Step (6): as shown in FIG. 2(f), on the substrate after step (5) a gate metal film is deposited with, and then through a sixth photolithography process, is formed into the patterns of the gate electrode 3 and the gate scanning line (not shown in the figure).

In this embodiment, the etching process of respective photolithography processes may be implemented with dry etching.

Obviously, various alternation and modification can be made by the ordinary skilled in this art, without departing from the spirit and essence of the present invention, which can also be regarded as the protective scope of this invention.

The invention claimed is:

1. A thin film transistor (TFT) array substrate comprising: a base substrate and a thin film transistor functioning as a switching element, the thin film transistor comprising a gate electrode, a semiconductor layer, a semiconductor protective layer, a source electrode and a drain electrode,
    wherein the semiconductor protective layer is disposed adjacent to the semiconductor layer and comprises a composite lamination structure, which comprises a protective layer formed of silicon oxide or a metal oxide and being in contact with the semiconductor layer and an insulating layer formed of an organic insulating material.

2. The TFT array substrate according to claim 1, wherein the ratio of thickness of the protective layer to that of the insulating layer is in a range from $1/10$ to $3/5$.

3. The TFT array substrate according to claim 2, wherein a thickness of the protective layer is in a range from 300 Å to 1500 Å, and a thickness of the insulating layer is in a range from 1000 Å to 20000 Å.

4. The TFT array substrate according to claim 1, wherein the protective layer is formed of $SiO_x$ or $Al_2O_3$, and the insulating layer is formed of an organic resin.

5. The TFT array substrate according to claim 1, further comprising a passivation layer and a transparent pixel electrode.

6. A liquid crystal display comprising the array substrate according to claim 1.

7. The TFT array substrate according to claim 1, wherein the gate electrode is provided on the base substrate, and the semiconductor layer is arranged over the gate electrode.

8. The TFT array substrate according to claim 7, wherein the semiconductor protective layer further comprises a gate insulating composite lamination structure disposed between the gate electrode and the semiconductor layer and adjacent to a lower side of the semiconductor layer, the gate insulating composite lamination structure comprises a gate insulating protective layer formed of silicon oxide or metal oxide and being in contact with the semiconductor layer and a gate insulating layer formed of an organic insulating material.

9. The TFT array substrate according to claim 8, wherein the semiconductor protective layer comprises an etching stop composite lamination structure arranged within the channel and adjacent to a topside of the semiconductor layer, and the etching stop composite lamination structure comprises an etching stop protective layer formed of silicon oxide or metal oxide and being in contact with the semiconductor layer and an etching stop insulating layer formed of an organic insulating material.

10. The TFT array substrate according to claim 7, wherein the source electrode and the drain electrode are arranged on the semiconductor layer, with a channel defined therebetween.

11. The TFT array substrate according to claim 7, wherein the semiconductor protective layer comprises an etching stop composite lamination structure arranged within the channel and adjacent to a topside of the semiconductor layer, and the etching stop composite lamination structure comprises an etching stop protective layer formed of silicon oxide or metal oxide and being in contact with the semiconductor layer and an etching stop insulating layer formed of an organic insulating material.

12. The TFT array substrate according to claim 1, wherein the semiconductor layer is arranged on the base substrate, and the gate electrode is provided on the semiconductor layer.

13. The TFT array substrate according to claim 12, wherein the semiconductor protective layer comprises a buffer insulating composite lamination structure located between the base substrate and the semiconductor layer and adjacent to a lower side of the semiconductor layer, and the buffer insulating composite lamination structure comprises a buffer insulating protective layer formed of silicon oxide or metal oxide and being in contact with the semiconductor layer and an buffer insulating layer formed of an organic insulating material.

14. The TFT array substrate according to claim 13, wherein the source electrode and the drain electrode are arranged on the semiconductor layer, with a channel defined therebetween.

15. The TFT array substrate according to claim 14, wherein the semiconductor protective layer comprises an etching stop composite lamination structure arranged within the channel and adjacent to the topside of the semiconductor layer, and the etching stop composite lamination structure comprises an etching stop protective layer formed of silicon oxide or metal oxide and being in contact with the semiconductor layer and an etching stop insulating layer formed of an organic insulating material.

16. The TFT array substrate according to claim 13, wherein the semiconductor protective layer further comprises an etching stop composite lamination structure arranged within the channel and adjacent to the topside of the semiconductor layer, and the etching stop composite lamination structure comprises an etching stop protective layer formed of silicon oxide or metal oxide and being in contact with the semiconductor layer and an etching stop insulating layer formed of an organic insulating material.

* * * * *